(12) United States Patent
Achehboune et al.

(10) Patent No.: US 11,299,392 B2
(45) Date of Patent: Apr. 12, 2022

(54) PACKAGING FOR MEMS TRANSDUCERS

(71) Applicant: Cirrus Logic International Semiconductor Ltd., Edinburgh (GB)

(72) Inventors: Rkia Achehboune, Edinburgh (GB); Roberto Brioschi, Austin, TX (US); Dimitris Drogoudis, Edinburgh (GB); David Patten, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/869,075

(22) Filed: May 7, 2020

(65) Prior Publication Data

US 2020/0377363 A1 Dec. 3, 2020

Related U.S. Application Data

(60) Provisional application No. 62/856,231, filed on Jun. 3, 2019.

(30) Foreign Application Priority Data

Jun. 20, 2019 (GB) .................................... 1908831

(51) Int. Cl.
- *H04R 19/00* (2006.01)
- *B81B 7/00* (2006.01)
- *B81C 1/00* (2006.01)
- *H04R 19/04* (2006.01)
- *H04R 31/00* (2006.01)

(52) U.S. Cl.
CPC ........ B81B 7/0064 (2013.01); B81C 1/00269 (2013.01); H04R 19/04 (2013.01); H04R 31/00 (2013.01); *B81B 2201/0257* (2013.01); *B81B 2203/0127* (2013.01); *B81B 2207/012* (2013.01); *H04R 2201/003* (2013.01)

(58) Field of Classification Search
CPC .......... B81B 7/0064; B81B 2201/0257; B81B 2203/0127; B81B 2207/012; B81B 7/007; B81B 2207/091; B81C 1/00269; H04R 19/04; H04R 31/00; H04R 2201/003; H04R 19/005

See application file for complete search history.

(56) References Cited

U.S. PATENT DOCUMENTS

| | | | |
|---|---|---|---|
| 2008/0063232 A1* | 3/2008 | Song | H04R 19/005 381/355 |
| 2010/0195299 A1* | 8/2010 | Souriau | H01L 24/96 361/760 |
| 2014/0145275 A1 | 5/2014 | Hong | |
| 2015/0001632 A1 | 1/2015 | Liu et al. | |

OTHER PUBLICATIONS

Combined Search and Examination Report under Sections 17 and 18(3), UKIPO, Application No. GB1908831.9, dated Dec. 6, 2019.

* cited by examiner

*Primary Examiner* — Matthew A Eason
(74) *Attorney, Agent, or Firm* — Jackson Walker L.L.P.

(57) ABSTRACT

The Application describes a substrate design for a MEMS transducer package. The substrate is defined by a conductive layer which forms the upper and lower surfaces of the substrate. The substrate is also provided with a conductive portion which is electrically isolated from the rest of the conductive layer. The conductive portion is supported between a first plane defined by the upper surface of the substrate and a second plane defined by the lower surface of the substrate by an electrically insulating moulding substance.

13 Claims, 7 Drawing Sheets

PACKAGING FOR MEMS TRANSDUCERS

The present disclosure claims priority to U.S. Provisional Patent Application Ser. No. 62/856231, filed Jun. 3, 2019, and United Kingdom Patent Application No. 1908831.9 filed Jun. 20, 2019, each of which is incorporated by reference herein in its entirety.

TECHNICAL FIELD

This application relates to packaging and packaging elements for a micro-electro-mechanical system (MEMS) device and to processes for fabricating such packaging and packaging elements. In particular, this application relates to packaging and packaging elements for a MEMS capacitive microphone device.

BACKGROUND

MEMS devices are becoming increasingly popular. MEMS transducers, and especially MEMS capacitive microphones, are increasingly being used in electronic devices and systems and especially portable electronic devices such as mobile telephones, headphones and other portable devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is biased by a potential difference provided across the membrane and backplate electrodes.

A MEMS transducer will typically be housed within a package which allows easy handling and assembly and serves to protect the primary substrate and the component supported thereby from e.g. mechanical damage, RF noise and environmental contamination. The package also provides a means—e.g. an external conductive contact—for connecting the package to a circuit board or other elements. A package which houses a microphone transducer will typically have a sound port to allow transmission of sound waves to/from the transducer within the package. The transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one or more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as to present a relatively high acoustic impedance at the desired acoustic frequencies but which allow for low-frequency pressure equalisation between the two volumes to account for pressure differentials due to temperature changes or the like.)

Various packaging configurations are known. For example, a package for a MEMS transducer typically comprises a package substrate, which may be formed of a printed circuit board (PCB), and a cover portion which extends in a plane overlying the upper surface of the package substrate supported by side walls which are mounted to the upper surface of the package substrate (PCB). The cover portion may be provided by a lid structure which integrates both the cover portion and the side walls. The lid structure may be metal.

According to known configurations the MEMS transducer is attached to the upper surface of the package substrate within the chamber. The package may also comprise an integrated circuit (IC) which may be formed on a discrete die of semiconductor material or may be formed on the same die as the transducer. The integrated circuit will be customised for a particular application. The integrated circuit will be connected to electrodes of the transducer such that an electrically conductive path is provided between the integrated circuit and an electrical connection provided on an external surface of the package. The integrated circuit typically provides bias to the transducer and buffers or amplifies a signal from the transducer. The circuitry may conveniently be CMOS (complementary metal-oxide-semiconductor) circuitry and thus comprise various CMOS layers.

MEMS transducers are commonly being used in devices with communication capability, e.g. mobile telephones or the like. Such devices will include at least one antenna for transmitting RF signals. The amount of power transmitted by such devices can be relatively high and this can cause a problem for MEMS transducers, such as microphones, with CMOS circuitry. The transmitted RF signals can be coupled to the CMOS circuitry and, as the CMOS circuitry is inherently non-linear, such signals may be demodulated to the audio band. This may therefore result in audible noise such as the so-called "bumblebee noise".

It is known for electromagnetic shielding to be provided so as to protect a MEMS transducer and associated circuitry from electromagnetic radiation, in particular radio frequency interference (RFI). Such shielding is typically provided as part of the package cover e.g. by a conductive RF cap or lid which is grounded and serves to attenuate EM radiation incident on the package. The RF cap serves to shield the MEMS transducer and circuitry from RF radiation.

Although the shielding provided by the previously considered designs is useful at attenuating external RF radiation, difficulties in protecting circuitry from RFI still arise.

According to at least one example of a first aspect there is provided a substrate for a MEMS transducer package, the substrate comprising a conductive layer which defines upper and lower surfaces of the substrate and a conductive portion which is electrically isolated from the conductive layer, wherein the conductive portion is supported between a first plane defined by the upper surface of the substrate and a second plane defined by the lower surface of the substrate by an electrically insulating moulding substance.

The conductive layer may define a conductive frame of the substrate. The conductive frame may extend around the entire perimeter of the substrate.

According to at least one example the moulding substance extends between the outer perimeter of the conductive portion and an inner wall of an aperture formed through the conductive layer of the substrate. The moulding substance can be considered to define a connecting frame.

According to at least one example the substrate comprises a plurality of conductive portions, each being electrically isolated from the conductive layer of the substrate and from each other. Thus, each conductive portion is supported between the first plane and the second plane by an electrically insulating moulding substance.

According to at least one example the substrate further comprises a hole which extends through the substrate from the upper planar surface to the lower planar surface thereof.

According to at least one example of a second aspect there is provided an assembly comprising a substrate according to an example of the first aspect and a conductive lid structure. The lid structure may be mounted to the upper surface of the substrate to define an interior chamber. The lid structure may comprise a cover portion which extends over the substrate and at least one side wall. A terminating portion of the side wall(s) of the lid structure may be mounted to the conductive frame region of the substrate.

According to at least one example of a third aspect there is provided a MEMS transducer package comprising:
an assembly according to an example of the second aspect, wherein the substrate of the assembly forms a package substrate of the MEMS transducer package;
an intermediate substrate provided on the first planar surface of the package substrate, the intermediate substrate comprising a cavity and being arranged relative to the package substrate so as to overly a hole which extends through the package substrate from the upper planar surface to the lower planar surface thereof;
a MEMS transducer provided on the upper surface of the intermediate substrate; and
electronic circuitry provided on the upper surface of the MEMS transducer.

The electronic circuitry may be provided by a discrete chip or die, or may be integrated with the MEMS transducer die.

According to at least one example of the third aspect the MEMS microphone transducer comprises a flexible membrane which deflects in response to a pressure differential across the membrane, and wherein the MEMS microphone transducer is provided such that the flexible membrane overlies the cavity of the intermediate substrate.

In use, the package substrate and the lid structure are typically provided at ground potential.

According to a further aspect there is provided an electronic device comprising a MEMS transducer package according to an example of the third aspect. The device may be, for example, at least one of: a portable device; a battery powered device; an audio device; a computing device; a communications device; a personal media player; a headphone; a mobile telephone; a games device; and a voice controlled device.

Features of any given aspect or example may be combined with the features of any other aspect or example and the various features described herein may be implemented in any combination in a given arrangement.

Associated methods of fabricating a substrate, an assembly and a MEMS transducer package are respectively provided.

BRIEF DESCRIPTION OF THE DRAWINGS

For a better understanding of the present invention and to show how the same may be carried into effect, reference will now be made by way of example to the accompanying drawings in which.

DETAILED DESCRIPTION

Figure 1A:
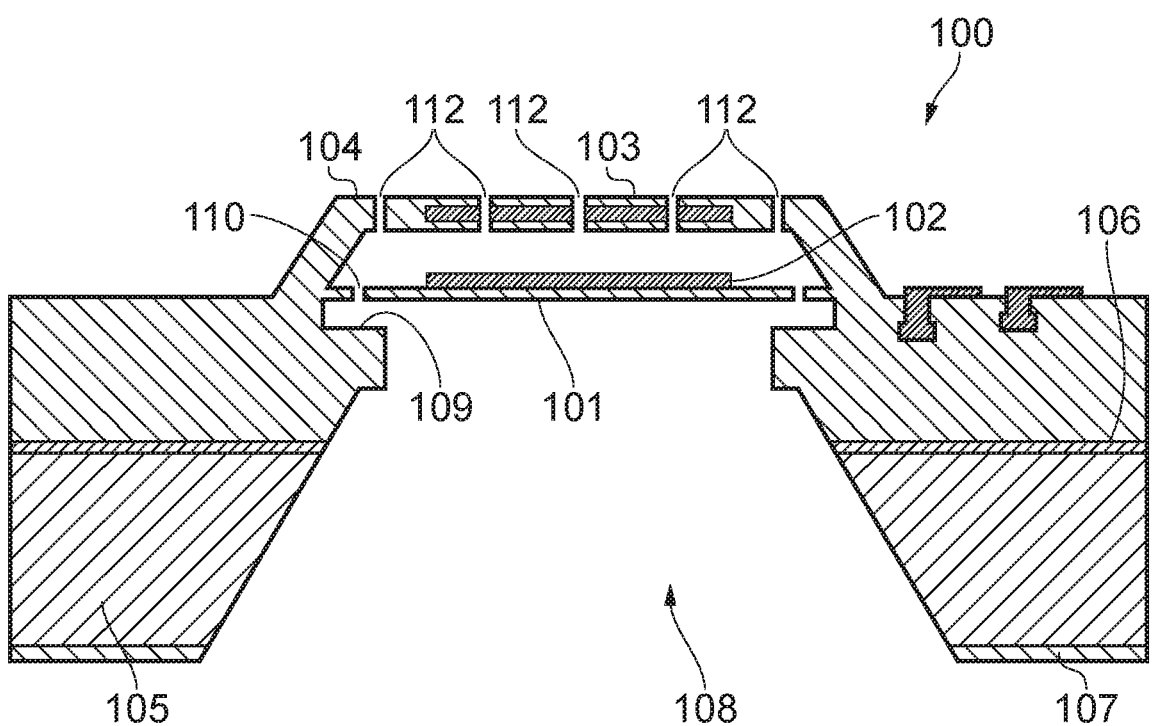
FIGS. 1a and 1b show a schematic diagram and a perspective view, respectively, of a known capacitive MEMS microphone device.

The description below sets forth examples and arrangements according to this disclosure. Further examples, arrangements and implementations will be apparent to those having ordinary skill in the art. Further, those having ordinary skill in the art will recognize that various equivalent techniques may be applied in lieu of, or in conjunction with, the examples discussed below, and all such equivalents should be deemed as being encompassed by the present disclosure.

The methods and products described herein can be implemented in a wide range of devices and systems including headphones, audio players, laptops, mobile phones, PDAs, hands-free sets, voice activated or voice-controlled devices and personal computers.

Throughout this description any features which are the same or similar to features in other figures have been given the same reference numerals.

Figure 1B:
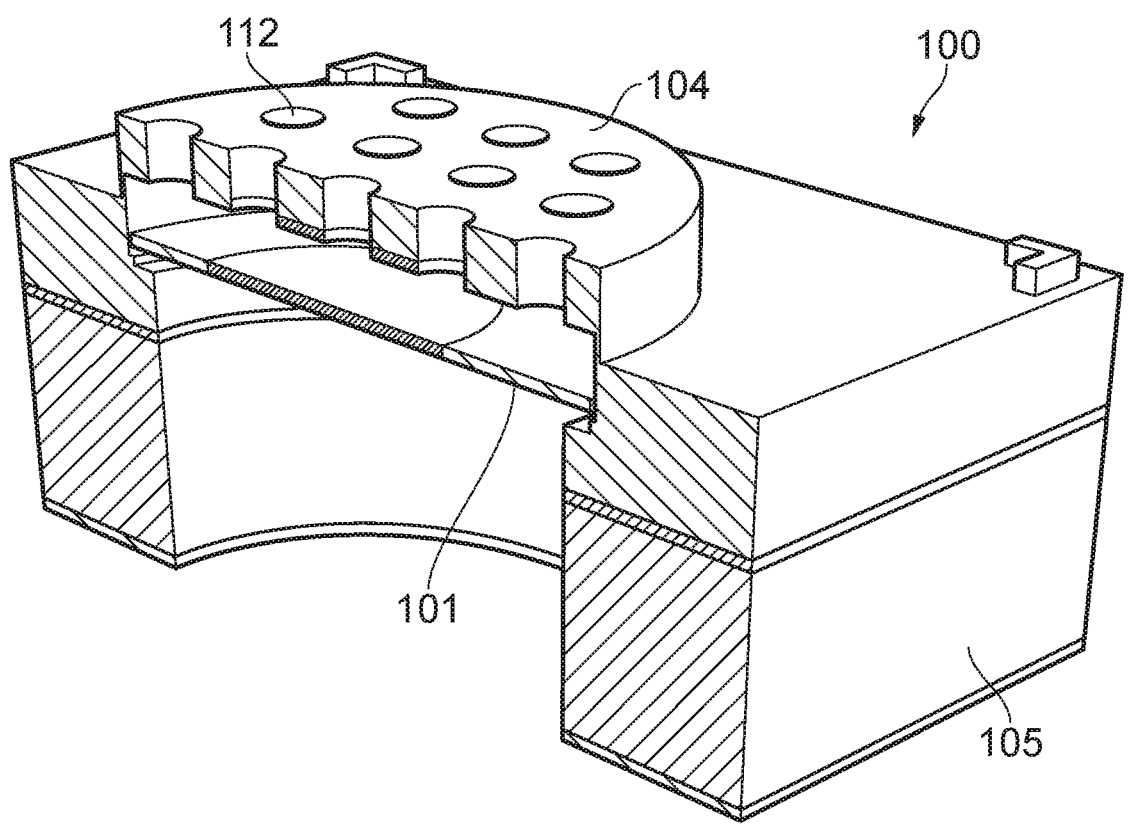

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1a the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 112 are arranged in the back-plate 104 so as to allow free movement of air molecules through the back plate, such that the second cavity 110 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 1a and 1b show the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

Figure 2:
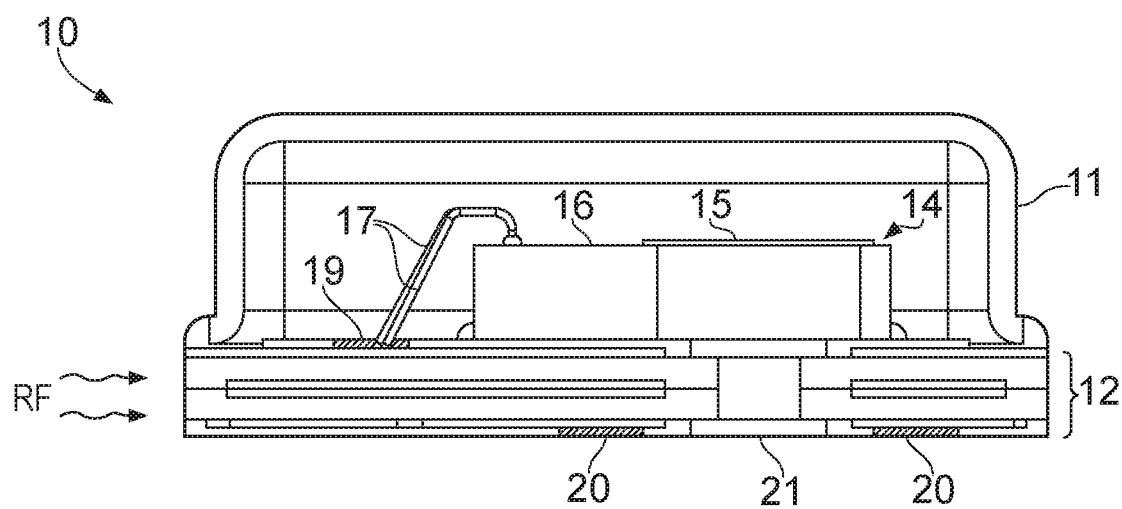
FIG. 2 illustrates a previously proposed package configuration.

The MEMS transducer will typically be housed within a package. FIG. 2 illustrates a previously proposed package configuration. The package 10 comprises a metal lid 11 mounted on the upper surface of a PCB substrate which forms the package substrate 12. The PCB—which is typically formed of FR4 material—mechanically supports an integrated MEMS transducer die 14 comprising a MEMS transducer 15 provided on the same die as electronic circuitry 16. Bond wires 17 provide an electrical interconnect between the circuitry 16 and at least one bond pad 19 provided on an upper surface of the substrate 12. The PCB, which exhibits a multilayer structure, facilitates an electrical interconnect between the, or each, bond pad 19 and a corresponding electrical connection 20 formed on the outer surface of the package substrate. According to convention, the configuration shown in FIG. 2—in which the sound port 21 is provided on the same side of the package as the external electrical connection 20—is known as a "bottom port" configuration. It will be appreciated that the term "bottom port" does not imply any particular orientation of the package device either during manufacture, processing or any subsequent application. In this example, the acoustic port 21 comprises a hole through the PCB substrate 12.

The metal lid 11 serves as an RF shield and provides effective protection to the components housed inside the package. In this sense, the conductive shielding can be considered to act in the manner of a Faraday shield, to protect the transducer and associated circuitry against external electromagnetic (EM) interference. However, from consideration of FIG. 2 it will be appreciated that the side edges of the PCB package substrate which comprises several horizontal layers of metal are potentially vulnerable to the lateral ingress of RF radiation.

Figure 3A:
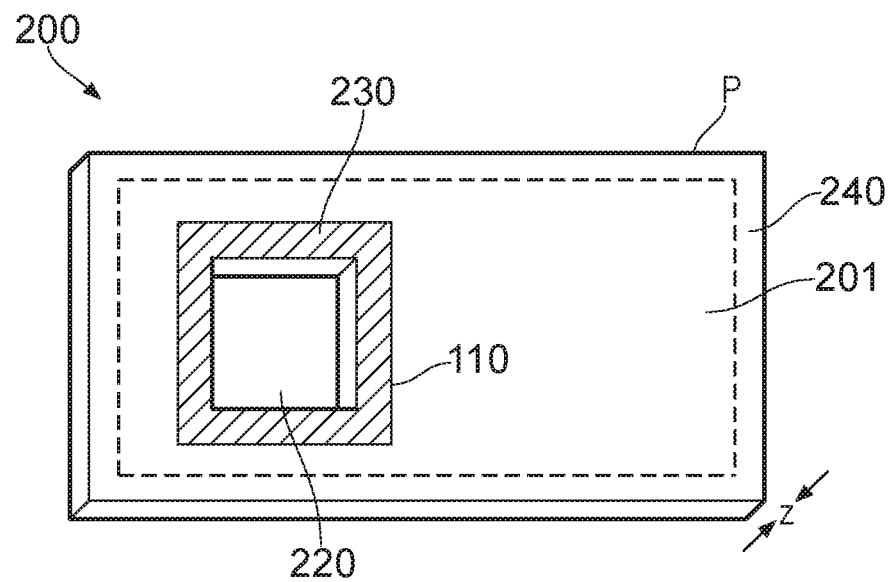
FIGS. 3a and 3b show upper elevational view and cross sectional view respectively of a substrate 200 according to a first present example.
Figure 3B:
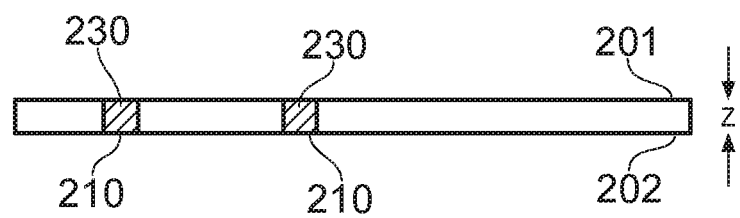

FIGS. 3a and 3b show upper elevational view and cross sectional view respectively of a substrate 200 according to a first present example. The substrate 200 is generally formed of an electrically conductive metal layer which defines an upper planar surface 201 and a lower planar surface 202 of the substrate. The electrically conductive metal layer also defines an outer perimeter P of the substrate 200—i.e. an electrically conductive outer perimeter. The substrate can be considered to comprise a conductive outer frame 240 which, in this example, extends around the entire perimeter of the substrate. For the purposes of illustration the conductive outer frame 240 is indicated by a dotted line, although it will be appreciated that in this example the lateral extend of the conductive outer frame is not physically delineated from the metal layer forming the rest of the substrate.

The substrate 200 also comprises a conductive portion 220. The conductive portion is provided between a first substrate plane defined by an upper planar surface 201 of the substrate 200 and a second substrate plane defined by a lower planar surface 202 of the substrate. As seen from FIG. 3b, the conductive region is substantially coplanar with the first and/or second substrate plane. The distance between the first substrate plane and the second substrate plane can be considered to define a planar height of the substrate. This is determined by this thickness z of the conductive—e.g. metal—layer which forms the main portion of the substrate.

The conductive portion 220 is held in fixed positional relationship relative to the main portion of the substrate by a moulding substance or moulding compound 230. The moulding substance 230 extends between the outer perimeter of the conductive portion 220 and the inner walls 210 of an aperture formed through the metal layer of the substrate. The moulding substance or moulding compound may comprise e.g. an epoxy mould material, a polymer or a polymeric material. The mould material is preferably a hardenable or settable material which may be dispensed or applied in liquid form to the region between the inner walls 210 of the substrate and the outer perimeter of the conductive portion 220 and allowed to harden in order to form a bond between the moulding material and the surfaces of the conductive portion 220 and the inner walls 210. The moulding material can be considered to define a moulded connecting frame 230. The moulded connecting frame 230 and the conductive portion 220 can be considered to be formed intra-planar to the substrate 200. The moulding substance may be an electrically insulating moulding substance.

It will be appreciated that whilst the illustrative Figures show only a single substrate, a plurality of substrates may be processed or formed as a batch from a panel of metal, wherein the panel comprises a plurality of regions each defining a single substrate portion. Indeed, the present aspects and examples seek to provide substrate structures and MEMS transducer packages which are particularly suitable for batch processing techniques.

Figure 4:
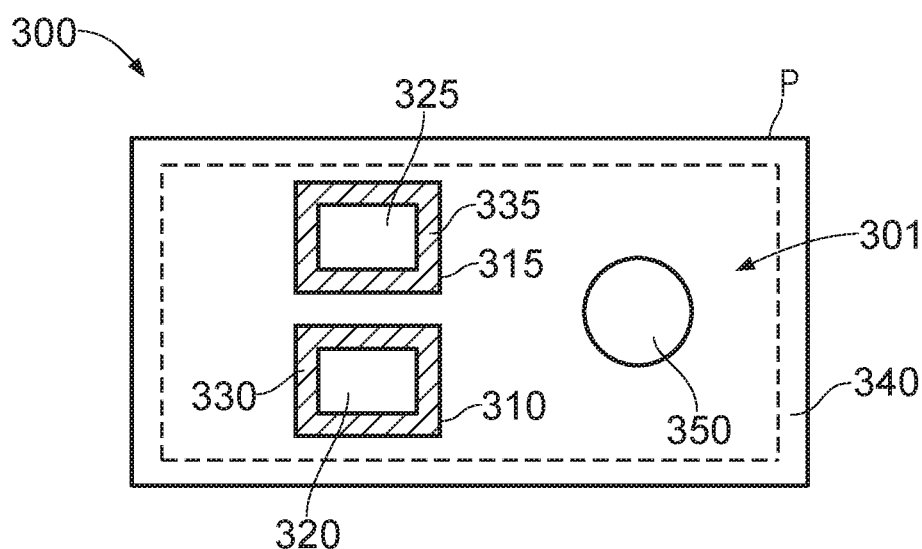
FIG. 4 shows a top plan view of a substrate 300 according to a second present example.

FIG. 4 shows a top plan view of a substrate 300 according to a second present example. The substrate 300 is generally formed of a conductive metal layer which defines an upper surface 301 and a lower surface (not shown) of the substrate. The conductive metal layer also defines an outer perimeter P of the substrate 300—i.e. a conductive outer perimeter.

The substrate 300 comprises a first conductive portion 320 and a second conductive portion 325. The first and second conductive portions 320, 325 are provided between a first substrate plane defined by the upper surface of the substrate 300 and a second substrate plane defined by the lower surface of the substrate 300. The first and second conductive portions are each held in fixed positional relationship relative to the main portion of the substrate 300 by a moulding substance or moulding compound. The moulding substance defines a first connecting frame 330 which defines a connection between the outer perimeter surface of the first conductive portion 320 and the inner walls of a first aperture 310 formed through the metal layer of the substrate 300. The moulding substance also defines a second connecting frame 335 which defines a connection between the outer perimeter surface of the second conductive portion 325 and the inner walls of a second aperture 315 formed through the metal layer of the substrate 300.

The substrate 300 also comprises a hole or opening 350 which extends through the plane of the substrate from an upper surface thereof to a lower surface thereof. In circumstances where the substrate 300 forms a substrate of a microphone transducer package, the opening 350 may form an acoustic port of the package.

It is envisaged that a substrate according to a present example may be provided in conjunction with a lid, for example a metal lid, in order to define a package comprising an interior chamber. According to at least one example the terminating portion of the side wall(s) of the lid may be mounted—e.g. solder bonded—to the conductive outer frame of a substrate according to a present example. It is envisaged that the substrate may support an internal or intermediate substrate on the upper surface thereof, wherein the intermediate substrate supports at least one die, such as a MEMS microphone die. Thus, the substrate in conjunction with the lid encloses the intermediate substrate within the chamber that is defined by the conductive substrate and the lid. The conductive substrate and lid are typically grounded and thus provide a RF enclosure which integrates both the lid and the substrate.

Figure 5:
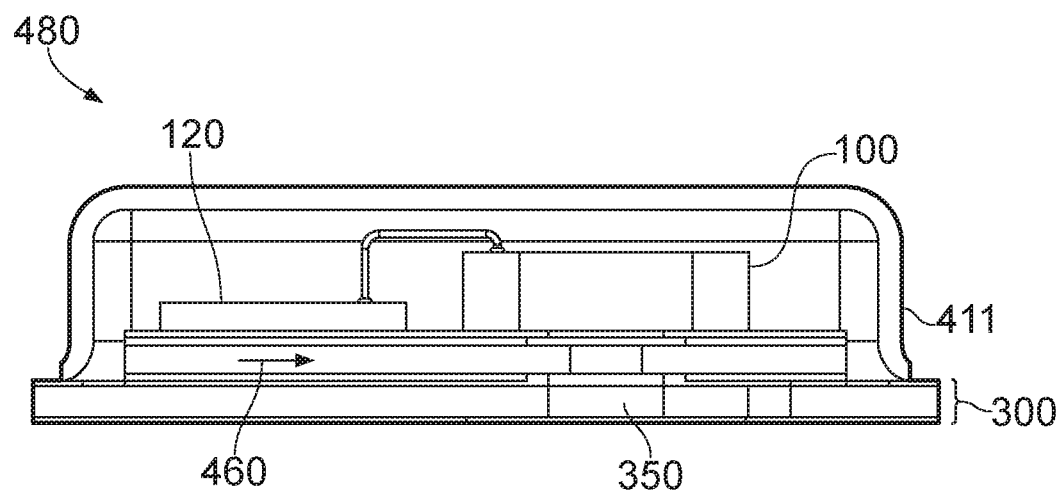
FIG. 5 which shows a cross section through a MEMS transducer package according to a present example.

Such a structure is illustrated in FIG. 5 which shows a cross section through a MEMS transducer package 480 according to a present example. The transducer package 480 is defined by a substrate 300, which is similar to the substrate illustrated in FIG. 4, and a metal lid 411. Thus, the substrate 300 forms a package substrate according to the illustrated configuration. The metal lid 411 is attached to the outer frame region 340 of the substrate 300 using a lid attach material e.g. solder or conductive epoxy. An intermediate substrate 460 comprising e.g. a PCB substrate is provided on the upper surface of the substrate 300. The intermediate substrate 460 is provided relative to the substrate such that a cavity formed through the intermediate substrate overlies the cavity 350 provided in the substrate 300, and also so that first and second electrical contacts provided on the lower surface of the intermediate substrate 460 at least partially overlie (or laterally align with) the first and second isolated conductive portions 320 and 325 of the substrate 300. A MEMS transducer die 100 is mounted on an upper surface of the intermediate substrate 460 such that the flexible membrane overlies the cavity of the intermediate substrate as well as the cavity 350 formed in the substrate 300. An IC 120 is also provided on the intermediate substrate and is wire bonded to the MEMS transducer. According to a working arrangement, the substrate 300, in particular the outer frame region 340 of the substrate 300, and the metal lid are grounded whilst the first and second isolated conductive portions 320 and 325 provide external contact points for power and output signal respectively. The substrate 300 can be considered to be a lead frame of the package.

It will be appreciated from consideration of FIG. 5 that the package configuration formed by the substrate 300 in conjunction with the lid 411, provides improved protection from RF radiation. In particular, the package 480 fully contains the intermediate substrate 460 which supports the MEMS die 100 and IC 120 and which would, according to previously proposed configurations, form the package substrate and supporting substrate for the metal lid. The provision of the conductive substrate 300 which comprises a conductive metal layer and is configured to support the terminating portion(s) of the side wall(s) of the metal lid, facilitates a continuously conductive connection between the side walls of the package and the conductive frame of the package substrate. The FIG. 5 arrangement can be seen to provide a more complete metal shield or enclosure which represents an improvement over the FIG. 2 package configuration and potentially alleviates the problems associated with the lateral ingress of RF radiation arising through the side surfaces of a PCB package substrate. The package configuration shown in FIG. 5 can be considered to comprise at least one package side wall which comprises a component formed of the lid 411 and a portion formed of the side surface of the substrate 300, wherein the components are mechanically and electrically coupled. Thus, according to the FIG. 5 configuration the entire package side wall is formed of a conductive material.

The examples illustrated in FIGS. 3 and 4 can be considered to exhibit a relatively simple substrate geometry or design. However, it will be appreciated that the specific design of the substrate may be customised for a particular application and/or to enhance the electrical and/or thermal properties thereof. Typically the starting material for the substrate will be a layer or flat panel of metal, e.g. copper or copper-alloy. Methods of photo etching and/or stamping are typically used to remove regions of the metal material and to create the required substrate geometry.

Figure 6:
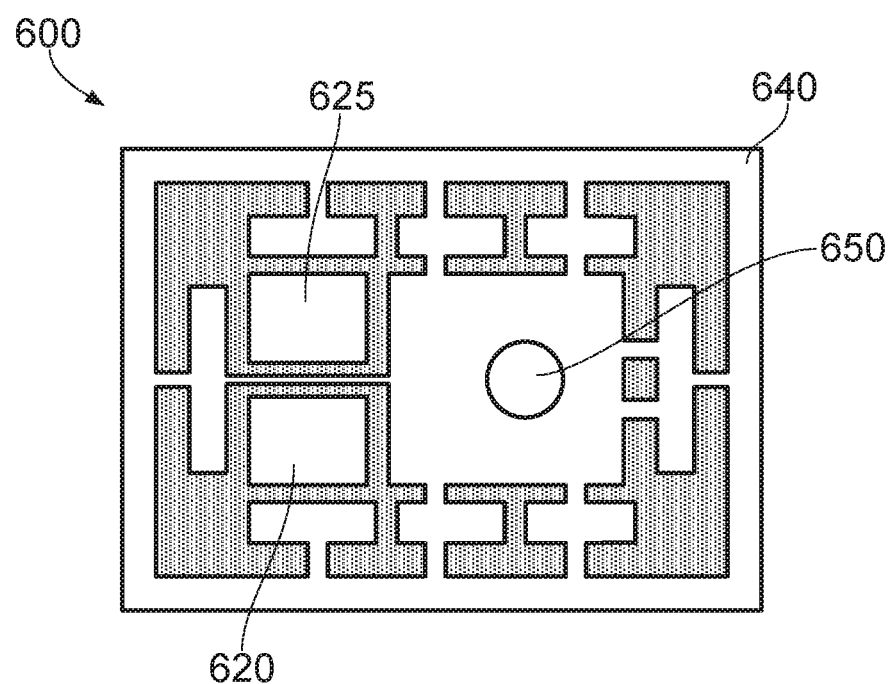
FIG. 6 shows a substrate according to a further present example.

FIG. 6 shows a substrate 600 according to a further present example. The substrate 600 comprises a conductive layer which defines a conductive outer frame 640 and which is in mechanical and electrical connection with a plurality of other metal features which define the overall geometry and design of the substrate. The substrate further comprises first and second conductive portions 620 and 625 which are electrically isolated from the rest of the conductive metal layer. An aperture or hole 650 is formed through the conductive layer of the substrate.

FIGS. 7a to 7g illustrate a process for flow for fabricating a package according to one example. It will be appreciated that the Figures show a single unit but that the process is a batch assembly process wherein a plurality of packages are fabricated at the same time.

Figure 7A:
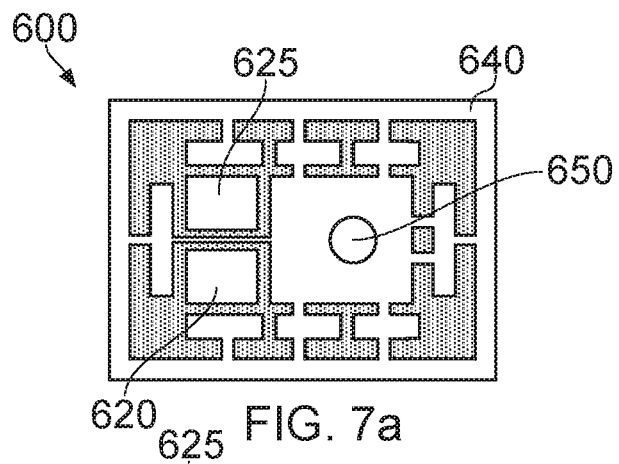
FIGS. 7a to 7g illustrate a process for flow for fabricating a package according to one example.
Figure 7B:
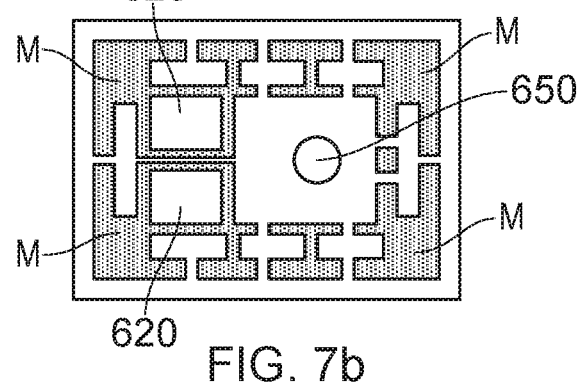

A panel of metal, such as copper or copper alloy, provides the starting material for the substrate. As illustrated in FIG. 7a, which shows a single unit substrate similar to the substrate illustrated in FIG. 6, each unit of the panel of metal is processed to remove regions of the metal material and to create the required substrate geometry. A moulding substance M is supplied to the void regions as illustrated in FIG. 7b, without filling the aperture or hole 650.

It will be appreciated that the conductive portions 620 and 625 are completely separated from the rest of the metal layer. Thus, during fabrication the panel may be formed on a carrier sheet (not shown) which allows the first and second conductive portions to be supported relative to the rest of the metal layer. Alternatively, the conductive portions may remain connected to the rest of the metal layer by means of a tie bar (not shown)—i.e. a connecting portion of metal that remains in place until a later stage when the moulding material has set.

Figure 7C:
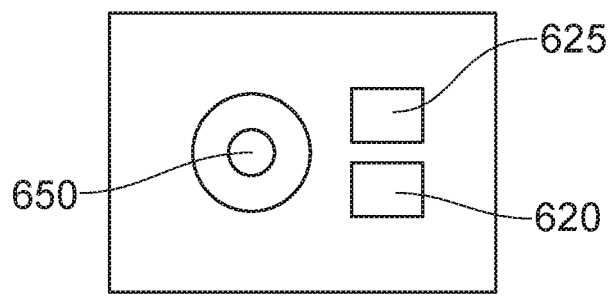

As illustrated in FIG. 7c, a solder mask 710 is applied to the lower side surface of the substrate leaving an annular metal region around the hole 650, as well as the first and second conductive portions 620 and 625, exposed on the lower surface.

Figure 7D:
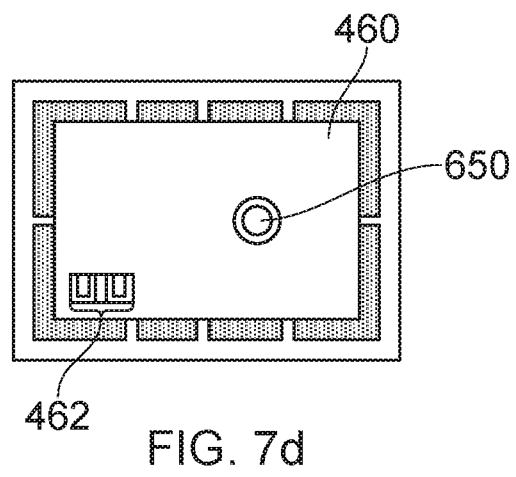

FIGS. 7d to 7g illustrate the process steps that take place to the upper side surface of the substrate. Specifically as illustrated in FIG. 7d, a PCB substrate 460 is mounted e.g. soldered to the upper surface of the substrate 600 such that a cavity formed through the intermediate substrate overlies the cavity 650 provided in the substrate 600, and also so that first and second electrical contacts provided on the lower surface of the intermediate substrate 460 at least partially overlie (or laterally align with) the first and second isolated conductive portions 620 and 625 of the substrate 600. The PCB substrate comprises three electrical contact points 462 on an upper surface thereof.

Figure 7E:
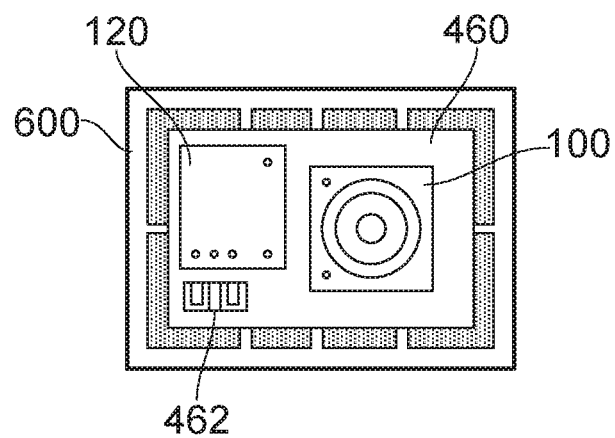

FIG. 7e illustrates the attachment of a MEMS transducer die 100 and an IC 120 to the upper surface of the intermediate substrate 460. The MEMS transducer die 100 is mounted on the upper surface of the intermediate substrate 460 such that the flexible membrane overlies the cavity of the intermediate substrate as well as the cavity 650 formed in the substrate 600.

Figure 7F:
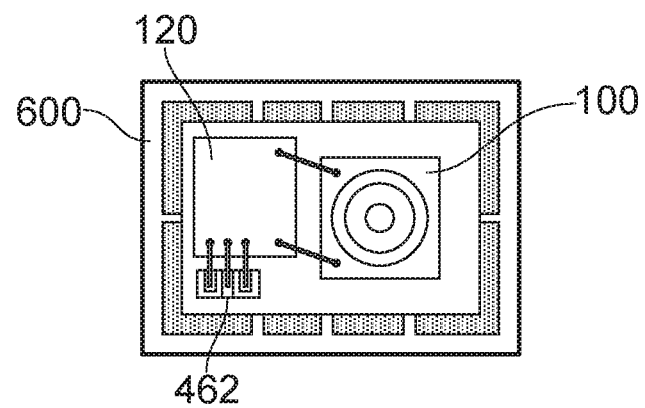
Figure 7G:
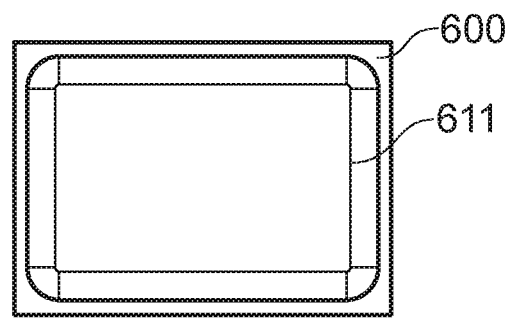

A process of wire bonding is illustrated in FIG. 7f which in use will facilitate an electrical connection being made for power and signal between the MEMS transducer die 100 and the IC, as well as ground, power and signal connections from the IC 120 to the contact points 462. Finally a metal lid 611 or RF cap is attached by mounting the side walls of the lid to the outer frame 640 of the substrate 600 using a solder or conductive epoxy.

In use, the assembly comprising the substrate 600 in conjunction with the metal lid form a substantially continuous ground enclosure, whilst the first and second isolated conductive portions 620 and 625 of the substrate 600 provide external contact points for power and output signal respectively.

Figure 8:
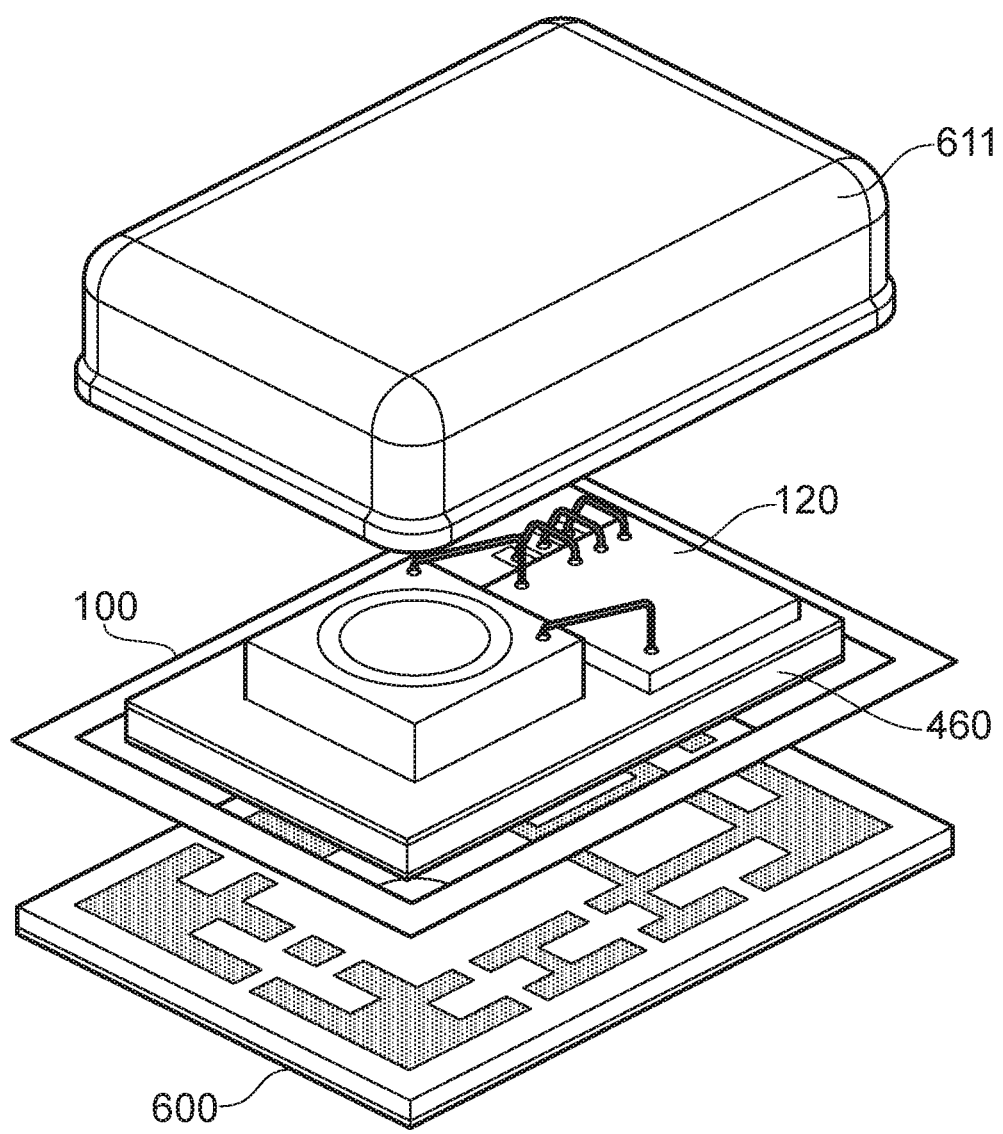
FIG. 8 illustrates an exploded perspective view of a package structure fabricated according to the process of FIG. 7.

FIG. 8 illustrates an exploded perspective view of a package structure fabricated according to the process of FIG. 7. A layer 620 of solder or conductive epoxy facilities a mechanical and electrical connection between the lid 611 and the substrate 600.

Whilst examples of the present aspects are particularly applicable to structures for supporting and/or packaging MEMS sensor transducers, especially capacitive transducers such as MEMS microphones, it will also be appreciated that other types of MEMS capacitive sensors could be implemented, for example accelerometers, pressure sensors, proximity sensors or flow meters.

It is noted that the example described above may be used in a range of devices, including, but not limited to: analogue microphones, digital microphones, pressure sensor or ultrasonic transducers. The example arrangements may also be used in a number of applications, including, but not limited to, consumer applications, medical applications, industrial applications and automotive applications. For example, typical consumer applications include portable audio players, laptops, mobile phones, PDAs and personal computers. Example arrangements may also be used in voice activated or voice controlled devices. Typical medical applications include hearing aids. Typical industrial applications include active noise cancellation. Typical automotive applications include hands-free sets, acoustic crash sensors and active noise cancellation.

It should be understood that the various relative terms above, below, upper, lower, top, bottom, underside, overlying, underlying, beneath, etc. that are used in the present description should not be in any way construed as limiting to any particular orientation of the transducer during any fabrication step and/or its orientation in any package, or indeed the orientation of the package in any apparatus. Thus the relative terms shall be construed accordingly.

It should be noted that the above-mentioned examples illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A MEMS transducer package comprising:
a substrate forming a package substrate of the MEMS transducer package, the substrate comprising:
a conductive layer which defines upper and lower surfaces of the substrate;
a conductive portion which is electrically isolated from the conductive layer, wherein the conductive portion is supported between a first plane defined by the upper surface of the substrate and a second plane defined by the lower surface of the substrate by an electrically insulating moulding substance;
an intermediate substrate provided on the first planar surface of the package substrate, the intermediate substrate comprising an aperture and being arranged relative to the package substrate so as to overly a hole which extends through the package substrate from the upper planar surface to the lower planar surface thereof;
a MEMS transducer provided on the upper surface of the intermediate substrate;
electronic circuitry provided on the upper surface of the intermediate substrate; and
a conductive lid structure, wherein the lid structure is mounted to the upper surface of the substrate to define an interior chamber.

2. A MEMS transducer package as claimed in claim 1 wherein the conductive layer defines a conductive frame of the substrate.

3. A MEMS transducer package as claimed in claim 2, wherein the conductive frame extends around the entire perimeter of the substrate.

4. A MEMS transducer package as claimed in claim 1, wherein the moulding substance extends between the outer perimeter of the conductive portion and an inner wall of an aperture formed through the conductive layer of the substrate.

5. A MEMS transducer package as claimed in claim 4, wherein the moulding substance defines a connecting frame.

6. A MEMS transducer package as claimed in claim 1, comprising a plurality of conductive portions, each being electrically isolated from the conductive layer of the substrate and from each other, and wherein each conductive portion is supported between the first plane and the second plane by an electrically insulating moulding substance.

7. A MEMS transducer package as claimed in claim 1, further comprising a hole which extends through the substrate from the upper planar surface to the lower planar surface thereof.

8. A MEMS transducer package as claimed in claim 1, wherein the lid structure comprises a cover portion which extends over the substrate and at least one side wall.

9. A MEMS transducer package as claimed in claim 8, wherein the conductive layer defines a conductive frame of the substrate, and wherein a terminating portion of the side wall(s) is mounted to the conductive frame of substrate.

10. A MEMS transducer package as claimed in claim 1, wherein the MEMS transducer comprises a MEMS microphone transducer and comprises a flexible membrane which deflects in response to a pressure differential across the membrane, and wherein the MEMS microphone transducer is provided such that the flexible membrane overlies the aperture of the intermediate substrate.

11. A MEMS transducer package as claimed in claim 1, wherein in use the package substrate and the lid structure are at ground potential.

12. An electronic device comprising a MEMS transducer package as claimed in claim 1.

13. An electronic device as claimed in claim 12, wherein the device is at least one of: a portable device; a battery powered device; an audio device; a computing device; a communications device; a personal media player; a headphone; a mobile telephone; a games device; and a voice controlled device.

* * * * *